(12) United States Patent
Shindo

(10) Patent No.: US 11,739,435 B2
(45) Date of Patent: Aug. 29, 2023

(54) SINGLE-CRYSTAL FIBER PRODUCTION EQUIPMENT AND SINGLE-CRYSTAL FIBER PRODUCTION METHOD

(71) Applicant: Crystal Systems Corporation, Hokuto (JP)

(72) Inventor: Isamu Shindo, Hokuto (JP)

(73) Assignee: Crystal Systems Corporation, Hokuto (JP)

( * ) Notice: Subject to any disclaimer, the term of this patent is extended or adjusted under 35 U.S.C. 154(b) by 0 days.

(21) Appl. No.: 17/610,871

(22) PCT Filed: Feb. 12, 2021

(86) PCT No.: PCT/JP2021/005138
§ 371 (c)(1),
(2) Date: Nov. 12, 2021

(87) PCT Pub. No.: WO2022/107345
PCT Pub. Date: May 27, 2022

(65) Prior Publication Data
US 2022/0349085 A1  Nov. 3, 2022

(30) Foreign Application Priority Data
Nov. 19, 2020 (JP) ................................ 2020-192453

(51) Int. Cl.
*C30B 13/22* (2006.01)
*C30B 13/00* (2006.01)
(Continued)

(52) U.S. Cl.
CPC ............ *C30B 13/005* (2013.01); *C30B 13/22* (2013.01); *C30B 13/32* (2013.01); *C30B 15/16* (2013.01); *C30B 29/12* (2013.01)

(58) Field of Classification Search
CPC ....... C30B 13/005; C30B 13/22; C30B 13/32; C30B 15/16; C30B 29/12; Y10T 117/1088; Y10S 117/905
See application file for complete search history.

(56) References Cited

U.S. PATENT DOCUMENTS

| 11,352,712 B1 * | 6/2022 | Buric ...................... C30B 13/30 |
| 2002/0112659 A1 * | 8/2002 | Sekijima .................. C30B 13/00 |
| | | 117/50 |

(Continued)

FOREIGN PATENT DOCUMENTS

| EP | 2013164077 | * | 7/2013 |
| JP | S51133104 A | | 11/1976 |

(Continued)

OTHER PUBLICATIONS

Feigelson, "Pulling Optical Fibers", Journal of Crystal Growth, 1986, pp. 669-680, vol. 79, North-Holland, Amsterdam.

*Primary Examiner* — Robert M Kunemund
(74) *Attorney, Agent, or Firm* — THE WEBB LAW FIRM

(57) ABSTRACT

[Object] To provide a single-crystal fiber production equipment and a single-crystal fiber production method that do not at all require high precision control necessary for a conventional single-crystal production equipment, can very easily maintain a stable steady state for a long time, and can stably produce a long single crystal fiber having a length of several hundreds of meters or more.
[Solution] The single-crystal fiber production equipment is used to produce a single crystal fiber by irradiating an upper surface of a raw material rod with a laser beam within a chamber to form a melt, immersing a seed single crystal in the melt, and pulling the seed single crystal upward. The single-crystal fiber production equipment includes: a laser light source that emits the laser beam as a collimated beam;

(Continued)

a pulling device configured to be upward and downward movable in a vertical direction with the seed single crystal held thereby; and a flat reflector that reflects the laser beam such that the reflected laser beam is incident vertically on the upper surface of the raw material rod. The upper surface of the raw material rod is irradiated with the laser beam such that the melt has a donut-shaped temperature distribution.

15 Claims, 6 Drawing Sheets

(51) Int. Cl.
    *C30B 13/32*     (2006.01)
    *C30B 15/16*     (2006.01)
    *C30B 29/12*     (2006.01)

(56) References Cited

U.S. PATENT DOCUMENTS

2008/0047303 A1* 2/2008 Huang ............... C03B 37/025
                                                                     65/392
2018/0051389 A1    2/2018 Maxwell et al.

FOREIGN PATENT DOCUMENTS

| | | |
|---|---|---|
| JP | 2002249399 A | 9/2002 |
| JP | 2018516829 A | 6/2018 |
| WO | 2016153537 A1 | 9/2016 |

* cited by examiner

[Fig. 1]
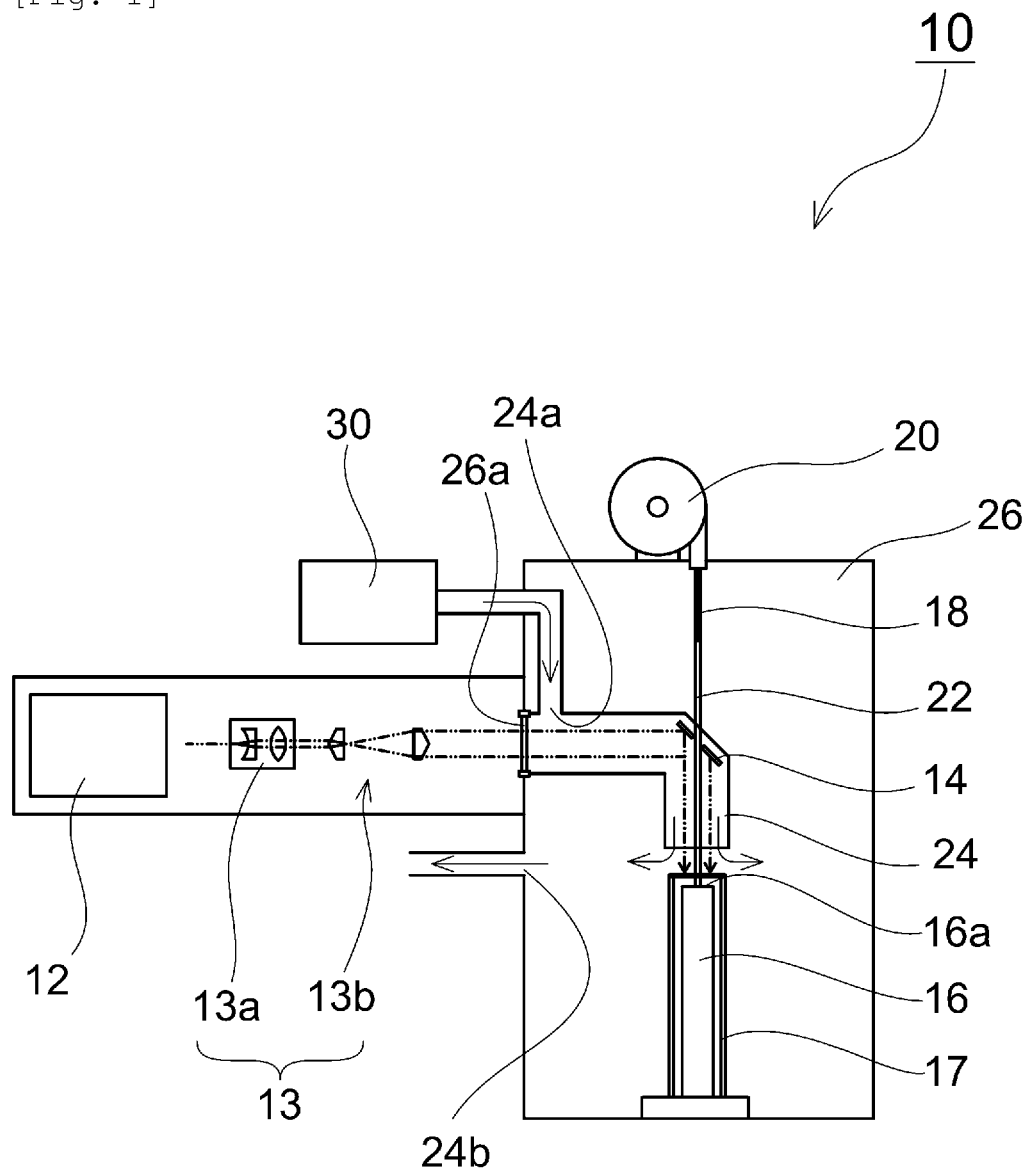

[Fig. 2]
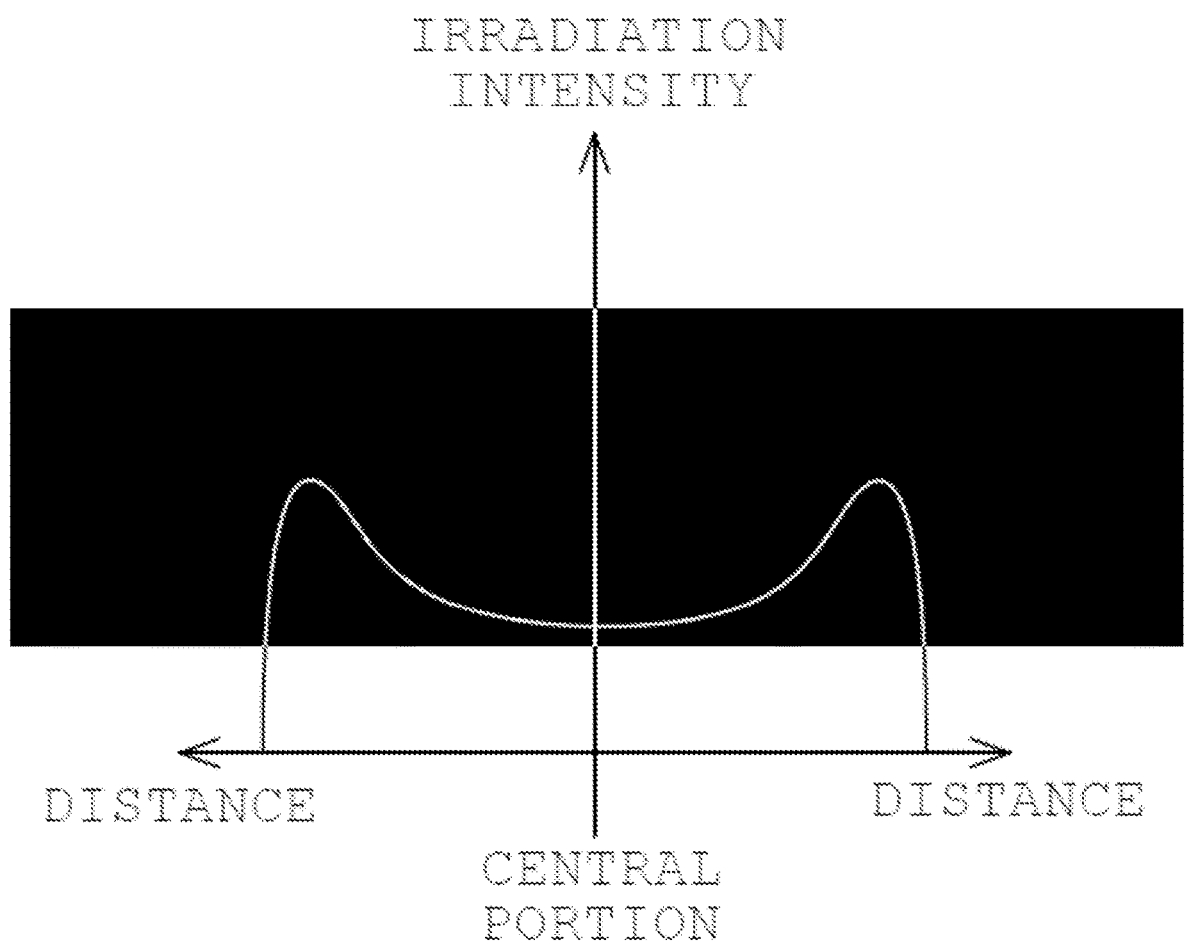

[Fig. 3]
(a)
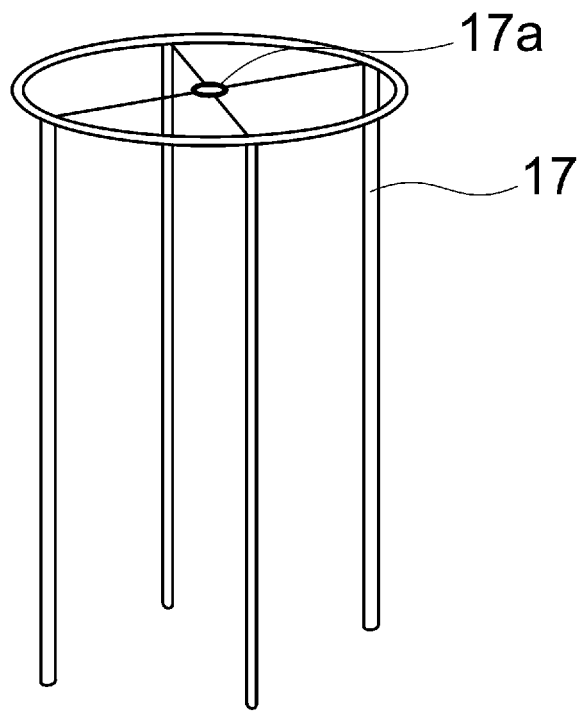
(b)
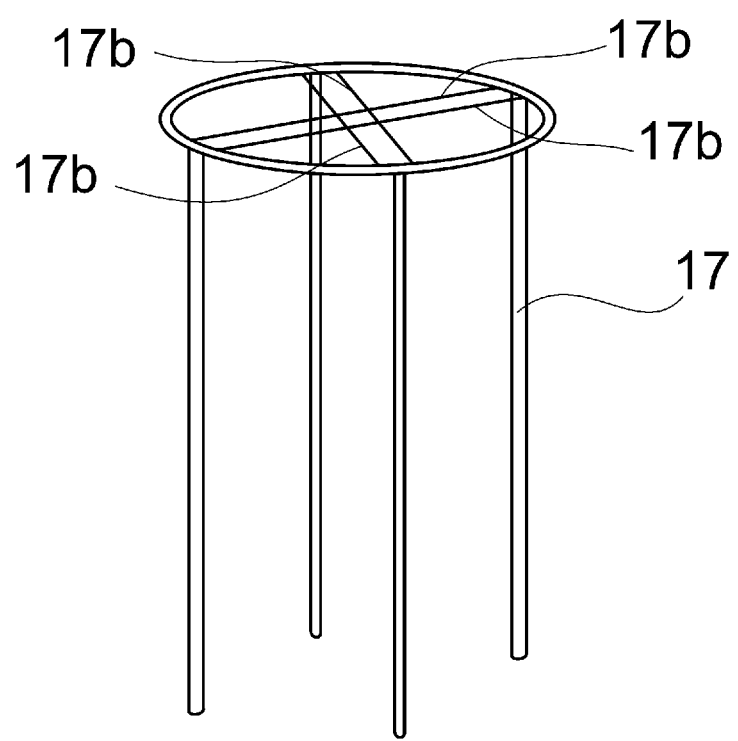

[Fig. 4]
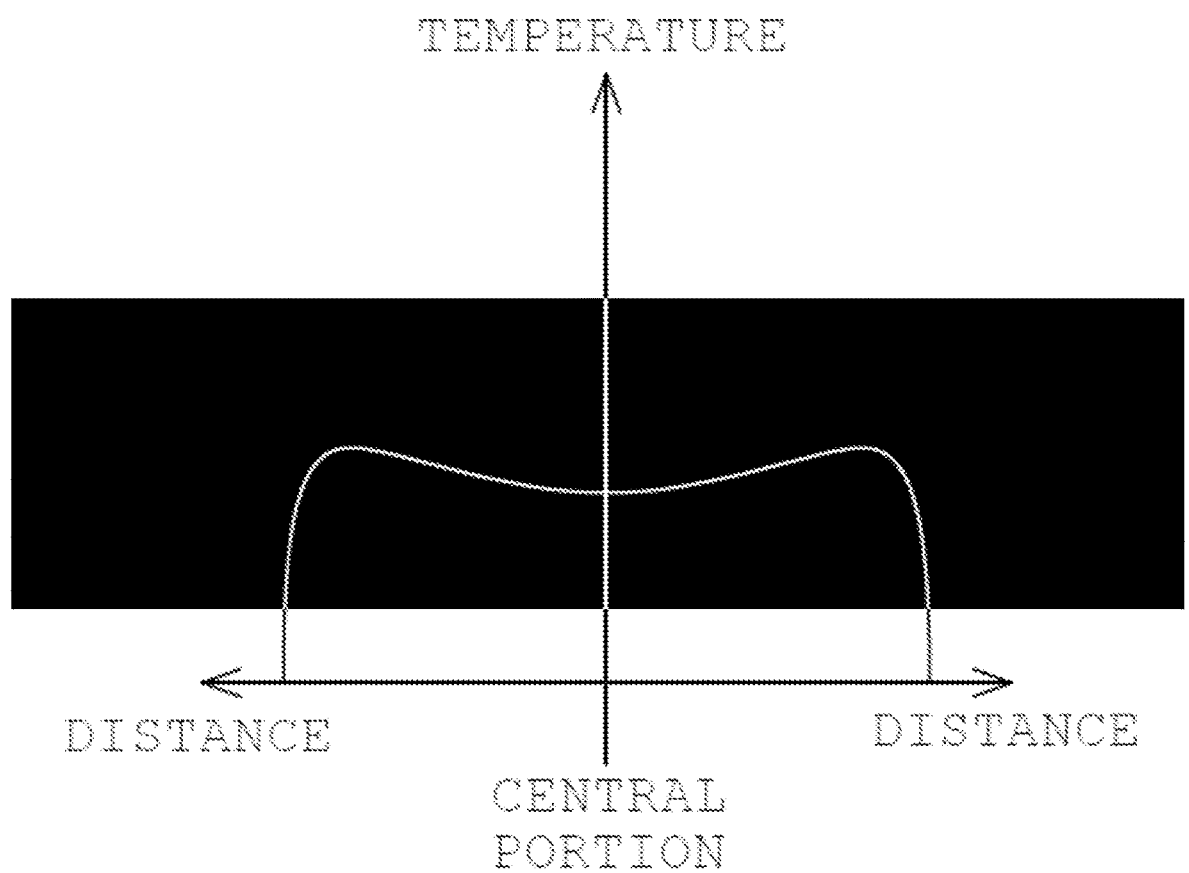

[Fig. 5]
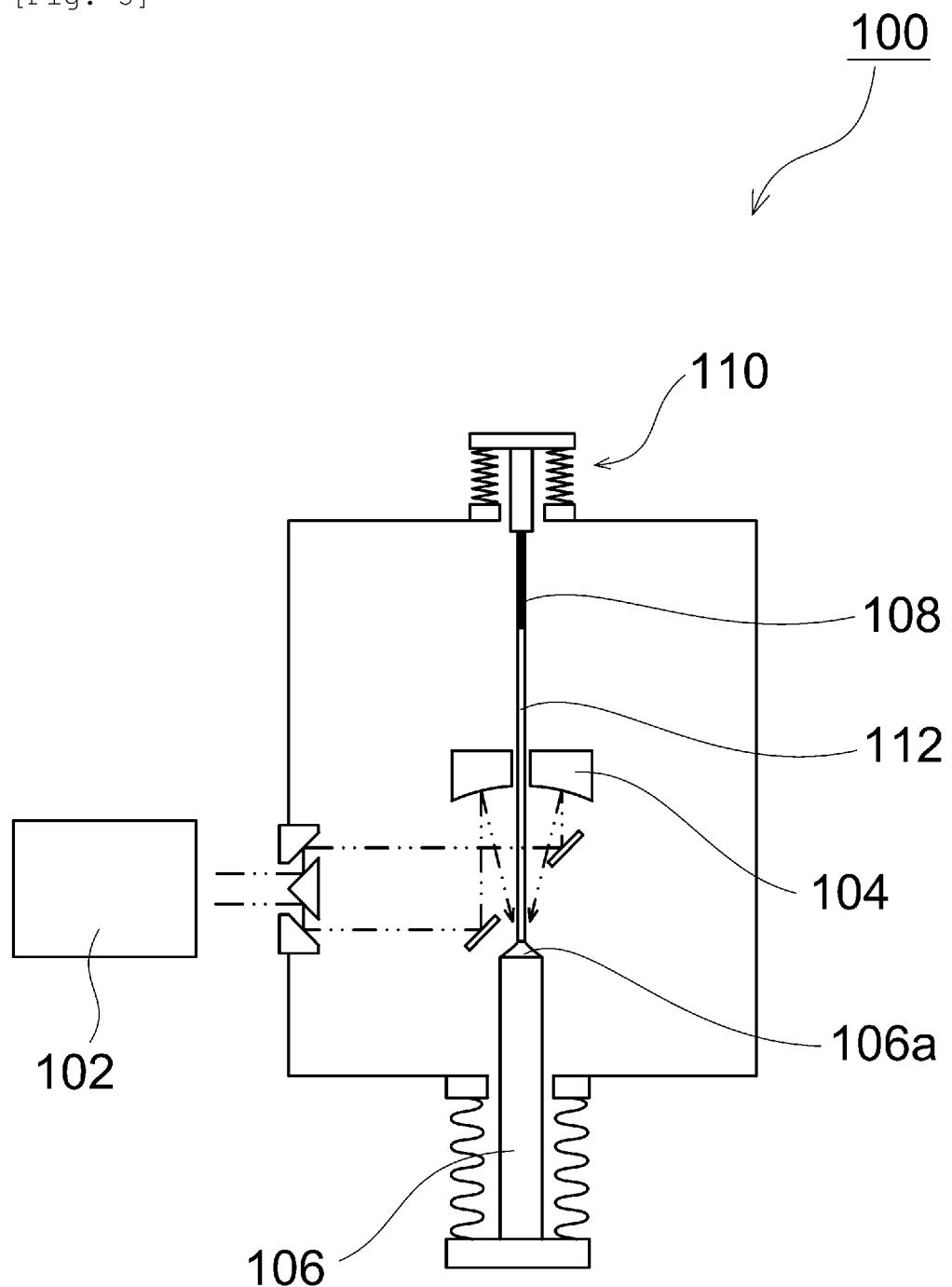

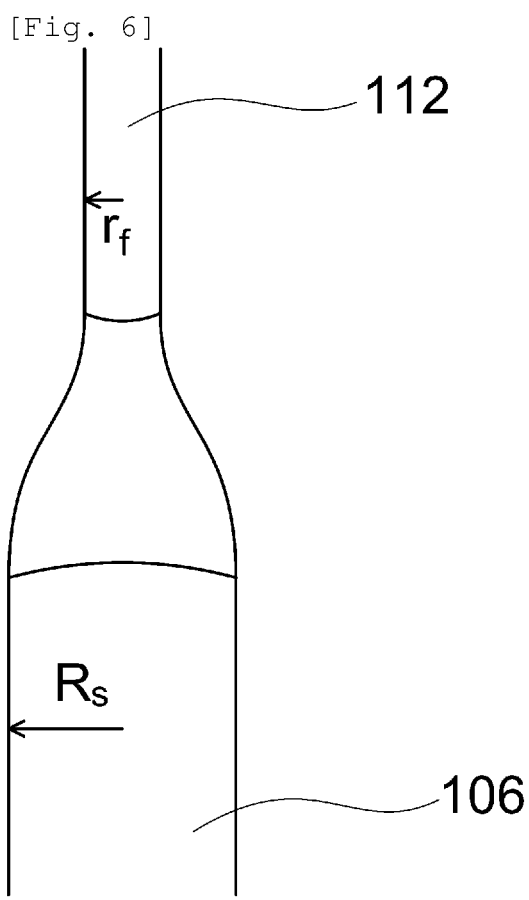
[Fig. 6]

SINGLE-CRYSTAL FIBER PRODUCTION EQUIPMENT AND SINGLE-CRYSTAL FIBER PRODUCTION METHOD

CROSS-REFERENCE TO RELATED APPLICATIONS

This application is the United States national phase of International Application No. PCT/JP2021/005138 filed Feb. 12, 2021, and claims priority to Japanese Patent Application No. 2020-192453 filed Nov. 19, 2020, the disclosures of which are hereby incorporated by reference in their entirety.

TECHNICAL FIELD

The present invention relates to a single-crystal production equipment and a single crystal production method and particularly to an equipment for producing an ultrafine single-crystal fiber having a diameter of several tens of micrometers and a length of at least several hundreds of meters and preferably several kilometers and a method for producing the single-crystal fiber.

BACKGROUND ART

To develop novel electronic devices and achieve a reduction in size of electronic components, higher performance, etc., a method for producing a high-quality ultrafine single-crystal fiber is undergoing development. In the 1980s, a method for producing a single-crystal fiber having a diameter of several tens of micrometers using a laser beam was developed mainly at Stanford University in the USA and named as a laser heated pedestal growth (LHPG) method (e.g., R. S. Feigelson, "Pulling optical fibers," Journal of Crystal Growth 79 (1986) 669-680). However, the LHPG method requires very precise control as described later and has not yet been put to practical use.

Therefore, methods with improved controllability have been developed such as a pulling down method and a p-PD method in which a single crystal fiber is produced by using a container such as a crucible and trickling a raw material melt gradually from a nozzle such that the raw material melt solidifies below the nozzle.

However, with these methods using the container, an appropriate container material is not found for some materials, and transfer of contamination from the container to the raw material melt cannot be ignored, so that their practical applications are hindered in many cases. There is therefore a need for development of a novel production method that can produce a high-purity and high-quality single crystal fiber stably at low cost without using a container.

SUMMARY OF INVENTION

Technical Problem

FIG. 5 is a schematic illustration of a single-crystal fiber production equipment using the conventional LHPG method.

As shown in FIG. 5, in the single-crystal fiber production equipment 100, a laser beam emitted from a laser light source 102 and reflected by a parabolic reflector 104 is focused onto an upper surface 106a of a raw material rod 106 to melt the raw material rod 106. Then a thin seed single crystal 108 having a target diameter is immersed in the melt obtained and pulled up using a pulling device 110.

The melt loses its heat to the seed single crystal 108, and a portion of the melt that is in contact with the seed single crystal 108 thereby solidifies and can be pulled up. A single crystal fiber 112 having a desired diameter can thereby be produced. It has been proposed that, to produce the single crystal fiber stably and continuously, the ratio of the radius $r_f$ of the single crystal fiber 112 produced to the radius $R_s$ of the raw material rod 106 is preferably set to about 1:3 as shown in FIG. 6.

When the single crystal fiber 112 is produced using the single-crystal fiber production equipment 100 by the conventional LHPG method, all control factors relating to melting and solidification of the raw material rod, i.e., for example, (1) the irradiation intensity of the laser beam,
(2) the irradiation distribution of the laser beam,
(3) the irradiation position of the laser beam,
(4) the vertical position of a forward end of the raw material rod,
(5) the horizontal position of the forward end of the raw material rod,
(6) the moving speed of the forward end of the raw material rod moving upward together with the single crystal fiber pulled upward,
(7) the horizontal position of the single crystal fiber, and
(8) the pulling rate of the single crystal fiber pulled upward must be controlled accurately and precisely in order to grow the single crystal fiber 112 stably.

For example, when a single crystal fiber having a diameter of 20 μm is produced, it is required that the control accuracy of the above positions be at least ±2 μm and preferably ±0.2 μm. However, it is very difficult to satisfy the above requirement, and this is one cause of the high cost of the single-crystal fiber production equipment.

In view of the foregoing circumstances, it is an object of the present invention to provide a single-crystal fiber production equipment and a single-crystal fiber production method that do not at all require high precision control of the above control factors necessary for the single-crystal fiber production equipment using the conventional LHPG method, can very easily maintain a stable steady state for a long time, and can stably produce a long single crystal fiber having a length of several hundreds of meters or longer.

Solution to Problem

The present invention has been made to solve the above problem in that it is necessary to control the positions very accurately in the conventional LHPG methods. The single-crystal fiber production equipment of the present invention is used to produce a single crystal fiber by irradiating an upper surface of a raw material rod with a laser beam within a chamber to form a melt, immersing a seed single crystal in the melt, and pulling the seed single crystal upward, the single-crystal fiber production equipment including:

a laser light source that emits the laser beam as a collimated beam;

a pulling device configured to be upward and downward movable in a vertical direction with the seed single crystal held thereby; and a flat reflector that reflects the laser beam such that the reflected laser beam is incident vertically on the upper surface of the raw material rod, the single-crystal fiber production equipment being configured for the upper surface of the raw material rod to be irradiated with the laser beam such that the melt has a donut-shaped temperature distribution.

Preferably, in the above single-crystal fiber production equipment, the laser beam has a donut-shaped intensity distribution.

Preferably, a radius of the raw material rod is equal to or larger than 10 times a radius of the single crystal fiber to be produced.

When the radius of the single crystal fiber to be produced is 100 μm or less, the radius of the raw material rod is in a range of preferably 2 mm to 5 mm.

The single-crystal fiber production equipment may further include a light guiding appliance that houses a laser beam introduction window of the chamber and the flat reflector.

In this case, which is configured such that an atmosphere gas may be introduced into the chamber through the light guiding appliance.

The single-crystal fiber production equipment may further include a position control apparatus that controls a horizontal position of the single crystal fiber such that the horizontal position falls within a prescribed limited range.

The single-crystal fiber production method of the present invention is a single-crystal fiber production method for producing a single crystal fiber, the method including: irradiating an upper surface of a raw material rod with a collimated laser beam to form a melt; immersing a seed single crystal into the melt; and pulling the seed single crystal upward, wherein the upper surface of the raw material rod is irradiated with the laser beam such that the melt has a donut-shaped temperature distribution.

Preferably, in the above single-crystal fiber production method, the laser beam has a donut-shaped intensity distribution.

Preferably, a radius of the raw material rod is equal to or larger than 10 times a radius of the single crystal fiber to be produced.

When the radius of the single crystal fiber to be produced is 100 μm or less, the radius of the raw material rod is in the range of preferably 2 mm to 5 mm.

Advantageous Effects of Invention

In the present invention, the raw material rod is consumed during the production of the single crystal fiber. However, the change in the vertical position of the forward end of the raw material rod is very small. For example, when a raw material rod having a radius of 3 mm is used to produce a single crystal fiber having a radius of 10 μm and a length of 100 m, the consumed length of the raw material rod is only about 1.1 mm.

Moreover, since the upper surface of the material rod is irradiated vertically from above with the laser beam while its shape is maintained constant, the shape and intensity of the irradiation laser beam are maintained constant even when the vertical position of the forward end of the raw material rod is slightly lowered. Therefore, even when the vertical position of the forward end of the raw material rod is lowered during the production of the single crystal fiber, it is unnecessary to control the positions of the raw material rod (the vertical and horizontal positions of the forward end of the raw material rod), and the portions of the raw material rod may be fixed.

It is therefore very easy to maintain the stable steady state for a long time, and a long single crystal fiber having a length of several hundreds of meters can be produced stably.

BRIEF DESCRIPTION OF DRAWINGS

FIG. 1 is a schematic illustration showing the structure of a single-crystal fiber production equipment in an embodiment.

FIG. 2 is a graph showing the intensity distribution of a laser beam.

FIG. 3 shows schematic illustrations of the structures of position control apparatuses.

FIG. 4 is a graph showing the temperature distribution of a melt.

FIG. 5 is a schematic illustration of a single-crystal fiber production equipment using the conventional LHPG method.

FIG. 6 is a schematic illustration showing the relation between the radius of a single crystal fiber and the radius of a raw material rod when a single crystal fiber is produced using the single-crystal fiber production equipment shown in FIG. 5.

DESCRIPTION OF EMBODIMENTS

Embodiments (Examples) of the present invention will next be described in more detail based on the drawings using the production of a lithium fluoride single crystal fiber as an example.

FIG. 1 is a schematic illustration showing the structure of a single-crystal fiber production equipment in an embodiment.

As shown in FIG. 1, the single-crystal fiber production equipment 10 in the present embodiment includes: a carbon dioxide gas laser light source 12 that emits a laser beam; an optical system 13 that shapes the laser beam such that the laser beam has an optimum diameter and a donut-shaped intensity distribution; a flat reflector 14 that reflects the laser beam horizontally incident thereon at a right angle in order to direct the laser beam to an upper surface 16a of a raw material rod 16; and a winding device 20 that causes a seed single crystal 18 to be immersed in a melt formed by melting the upper surface 16a of the raw material rod 16, pulls the seed single crystal 18 upward, and winds the resulting seed single crystal 18 around a drum.

The raw material rod 16, the seed single crystal 18, etc. are disposed inside a chamber 26, and a gas suitable for the target material, e.g., an atmosphere gas such as tetrafluoromethane when a lithium fluoride single crystal fiber is produced, is introduced into the chamber 26 from an atmosphere gas introducing device 30. A single crystal fiber 22 is produced in the chamber 26.

A laser beam introduction window (window 26a) for introducing a collimated laser beam emitted from the external laser light source 12 into the chamber 26 is provided in the chamber 26.

In the present embodiment, the laser light source 12 is configured such that the collimated laser beam having a donut-shaped intensity distribution shown in FIG. 2 can be emitted through the optical system 13.

In the present embodiment, the optical system 13 includes a beam expander 13a and an axicon lens 13b.

As shown in FIG. 1, the flat reflector 14 is disposed so as to surround the seed single crystal 18 such that the collimated laser beam emitted horizontally from the laser light source 12 is reflected at a right angle so as to be incident perpendicularly on the upper surface 16a of the raw material rod 16.

The winding device 20 is configured such that the seed single crystal 18 connected to, for example, a gold wire having a diameter of 15 μm is upward and downward movable in a vertical direction with the gold wire held by the winding device 20. After the seed single crystal has been immersed in the melt (raw material melt) formed on the upper surface 16a of the raw material rod 16 melted by the irradiation with the laser beam, the seed single crystal is pulled up at a prescribed rate, and the single crystal fiber 22 produced is wound around the drum.

In the present embodiment, it is preferable that the flat reflector 14 and the window 26a provided in the chamber 26 are housed in a light guiding appliance 24. By disposing the flat reflector 14 and the window 26a in the light guiding appliance 24 as described above and introducing the atmosphere gas into the light guiding appliance 24, the flat reflector 14 and the window 26a are prevented from being contaminated by substances evaporated from the melt (raw material melt) and adhering to the flat reflector 14 and the window 26a.

No particular limitation is imposed on the material forming the light guiding appliance 24. The light guiding appliance 24 may be formed using, for example, transparent quartz, stainless steel, etc.

When the light guiding appliance 24 is configured as described above, it is preferable that the atmosphere gas is introduced into the light guiding appliance 24 from the atmosphere gas introducing device 30 disposed near the window 26a of the chamber 26 through an introduction hole 24a and that the atmosphere gas is emitted into the chamber 26 from the light guiding appliance 24 at a position about 10 mm to about 20 mm above the melt of the raw material rod 16.

The chamber 26 has a discharge hole 24b disposed at a position near a side portion of the melt of the raw material rod 16 and is configured such that the atmosphere gas is discharged through the discharge hole 24b to the outside of the chamber 26. In this manner, a state in which the chamber 26 is filled with the atmosphere gas suitable for the production of the single crystal fiber 22 can be maintained.

In the present embodiment, a position control apparatus 17 is provided in order to reduce fluctuations in the horizontal position of the single crystal fiber 22 produced. No particular limitation is imposed on the position control apparatus 17 so long as it is configured so as to control the fluctuations in the horizontal position of the single crystal fiber 22 within a prescribed limited range.

The position control apparatus 17 is formed, for example, as a circular ring 17a shown in FIG. 3(*a*) or four orthogonal thin strings 17b disposed at prescribed intervals as shown in FIG. 3(*b*). The single crystal fiber 22 passes through a region inside the circular ring 17a or surrounded by the strings 17b, so that the fluctuating motion of the single crystal fiber 22 can be controlled by the circular ring 17a or the strings 17b.

When a single crystal fiber 22 having a diameter of several tens of micrometers is produced, the diameter of the circular ring 17a or the distance between adjacent strings 17b is preferably about 100 μm.

In the thus-configured single-crystal fiber production equipment 10 in the present embodiment, the raw material rod 16 used has a radius equal to or more than 10 times the radius of the single crystal fiber 22 to be produced. In particular, when the radius of the single crystal fiber 22 to be produced is 100 μm or less, the radius of the raw material rod is preferably in the range of 2 mm to 5 mm. By irradiating the upper surface 16a of such a raw material rod 16 with the laser beam, the irradiated portion of the raw material rod 16 is melted and liquified. Preferably, the outer diameter of the laser beam is approximately the same as or slightly larger than the diameter of the raw material rod 16. By optimizing the outer diameter of the laser beam, the entire upper surface 16a of the raw material rod 16 can be stably melted to obtain a melt.

In this case, the melt formed on the upper surface 16a of the raw material rod 16 has a temperature distribution shown in FIG. 4 in which the temperature in the outer circumferential portion is slightly higher than the temperature in the central portion (in the present description, such a temperature distribution is referred to as a "donut-shaped temperature distribution"). Since the irradiation laser beam has the donut-shaped intensity distribution shown in FIG. 2, the intensity of the laser beam having the above intensity distribution is higher in the circumferential portion than in the central portion. Therefore, in the melt (raw material melt) formed by irradiating the upper surface 16a of the raw material rod 16 with the laser beam, the amount of the irradiation laser beam is smaller in a portion around the center, and the amount of heat applied thereto is smaller. The melt (raw material melt) in the portion around the center is heated by heat transferred from the melt in the circumferential portion irradiated with the high-intensity laser beam and heated to a high temperature, so that the temperature of the portion around the center is lower than the temperature of the circumferential portion.

Even when the irradiation intensity of the laser beam fluctuates slightly, the influence of the fluctuations on the temperature of the melt in the portion around the center on the upper surface of the raw material rod 16 having the structure described above can be reduced, so that the temperature of the raw material melt can be stably maintained.

When the seed single crystal 18 is brought into contact with the melt in the raw material rod 16 in the above state, the melt loses its heat to the seed single crystal 18 through heat transfer, and therefore the melt in contact with the seed single crystal 18 solidifies and can be pulled up. In this case, the single crystal fiber 22 produced is immersed in the raw material melt having a diameter sufficiently larger than the diameter of the single crystal fiber 22 produced. Since the temperature of the interfacial portion between the single crystal fiber 22 and the raw material melt is low because of the heat transfer to the single crystal fiber 22 produced, the formation of the single crystal is continued.

The heat transferred to the single crystal fiber 22 dissipates from its circumferential portion as radiant heat, so that the formation of the single crystal is continued. Therefore, when the thermal conductivity of the material of the single crystal fiber 22 is high, the pulling rate can be increased. When the diameter of the single crystal fiber 22 is small, the ratio of its surface area is high. In this case, even when the thermal conductivity of the material of the small-diameter single crystal fiber 22 is low, the dissipation of heat from the surface allows the single crystal fiber 22 to be pulled up at a rate an order of magnitude faster than that in conventional bulk single crystal production methods such as a pulling method frequently used for industrial applications, and a high-quality single crystal fiber 22 can be produced at low cost.

When the melt has the donut-shaped temperature distribution described above, the temperature of a portion of the seed single crystal 18 that is in contact with the melt of the raw material rod 16 is almost unchanged even when the positional accuracy of the seed single crystal 18 is not high, so that the growth of the single crystal is almost not affected.

In the present invention, the laser beam is not focused but is used as a collimated beam and incident perpendicularly on the upper surface 16a of the raw material rod 16. Therefore, even when the raw material rod 16 is consumed and reduced in length during the production of the single crystal fiber 22, a reduction in the length of the raw material rod 16 is limited because the radius of the raw material rod 16 is sufficiently larger than the radius of the single crystal fiber 22. Therefore, the intensity of the laser beam incident on the upper surface 16a of the raw material rod 16 is always constant, and the amount of the melt formed on the upper surface 16a of the raw material rod 16 is unchanged. Therefore, when the length (the amount of change in the length) of the raw material rod 16 shortened due to consumption of the raw material rod 16 during the production of the single crystal fiber 22 is about 20 mm or less, it is unnecessary to change the vertical position of the forward end of the raw material rod 16.

Therefore, in the single-crystal fiber production equipment 10 of the present invention, it is unnecessary to control the position irradiated with the laser beam and the vertical and horizontal positions of the forward end of the raw material rod, and it is unnecessary to control the irradiation intensity of the laser beam and the horizontal position of the seed single crystal with high accuracy as in the conventional LHPG method.

In the single-crystal fiber production equipment 10 of the present invention, even when the single crystal material used is an incongruent melting material or a solid solution material, it is unnecessary to perform high-accuracy control, and the production can be continued stably for a long time.

When the single crystal material used is an incongruent melting material or a solid solution material, the composition of the melt is adjusted to the composition of a liquid phase (hereinafter referred to as a "solvent") that coexists in equilibrium with a solid having the composition of the single crystal fiber 22 to be produced. In this case, the melting point of the solvent is generally often lower by about several tens of degrees than the melting point of the material of the single crystal fiber 22 to be produced.

Even in such a case, when the single crystal fiber 22 is produced from a raw material rod 16 having a radius sufficiently larger than the radius of the single crystal fiber 22 to be produced, i.e., from a solvent having a large diameter, the temperature of the solvent is almost unchanged even when the position of the single crystal fiber 22, i.e., the position of the seed single crystal 18, is changed by about several tens of micrometers, so that its influence on the growth of the single crystal is negligible.

When the single crystal material used is an incongruent melting material or a solid solution material, the radius of the raw material rod 16 is preferably equal to or larger than 100 times the radius of the single crystal fiber 22 to be produced and is more preferably about 2 mm to about 5 mm. This is because the above radius range is favorable in order to stably maintain the range in which a portion of the solvent (interfacial region) that is discharged from the solid-liquid interface and has a composition with a high concentration is homogenized by solution diffusion during the growth of the single crystal, so that the growth of the single crystal can be stabilized.

As the single crystal fiber 22 grows, the composition and amount of the solvent vary, and the composition moves toward a low-melting point side. As the amount of the solvent decreases, the amount of the laser beam that passes through the solvent and reaches the interface between the solvent and the raw material rod increases, and this acts such that the dissolution of the raw material rod in the solvent is facilitated. Thus, the composition and amount of the solvent are always maintained constant. Therefore, the composition and diameter of the single crystal fiber 22 grown are always constant, and the single crystal fiber 22 produced can have a prescribed composition and a constant diameter.

The preferred embodiments of the present invention have been described, but the invention is not limited to these embodiments. For example, in the above embodiments, the laser beam having the donut-shaped intensity distribution is used in order to allow the melt of the raw material rod 16 to have the donut-shaped temperature distribution. However, the laser beam may have, for example, a Gaussian-shaped intensity distribution. When a laser beam having a Gaussian-shaped intensity distribution is used, a light-shielding plate etc. may be disposed in the optical path of the laser beam in order to reduce the temperature of a portion around the center. As described above, various changes are possible within the range of the object of the present invention.

REFERENCE SIGNS LIST

10 single-crystal fiber production equipment
12 laser light source
13 optical system
13a beam expander
13b axicon lens
14 flat reflector
16 raw material rod
16a upper surface
17 position control apparatus
17a circular ring
17b string
18 seed single crystal
20 winding device
22 single crystal fiber
24 light guiding appliance
24a introduction hole
24b discharge hole
26 chamber
26a window
30 atmosphere gas introducing device
100 single-crystal fiber production equipment
102 laser light source
104 parabolic reflector
106 raw material rod
106a upper surface
108 seed single crystal
110 pulling device
112 single crystal fiber

The invention claimed is:

1. A single-crystal fiber production equipment for producing a single crystal fiber by irradiating an upper surface of a raw material rod with a laser beam within a chamber to form a melt, immersing a seed single crystal in the melt, and pulling the seed single crystal upward, the single-crystal fiber production equipment comprising:
   a laser light source that emits the laser beam as a collimated beam having an intensity in a central portion of the laser beam that is less than an intensity at a periphery of the laser beam;
   a pulling device configured to be upward and downward movable in a vertical direction with the seed single crystal held thereby; and
   a flat reflector that reflects the laser beam such that the reflected laser beam is incident vertically on the upper surface of the raw material rod,
   the single-crystal fiber production equipment being configured for the upper surface of the raw material rod to be irradiated with the laser beam such that the melt has a donut-shaped temperature distribution, wherein a temperature in a central portion of the melt is less than a temperature at a periphery of the melt.

2. The single-crystal fiber production equipment according to claim 1, wherein a radius of the raw material rod is equal to or larger than 10 times a radius of the single crystal fiber to be produced.

3. The single-crystal fiber production equipment according to claim 2, wherein, when the radius of the single crystal fiber to be produced is 100 μm or less, the radius of the raw material rod is in a range of 2 mm to 5 mm.

4. The single-crystal fiber production equipment according to claim 1, further comprising a light guiding appliance that houses a laser beam introduction window of the chamber and the flat reflector.

5. The single-crystal fiber production equipment according to claim 4, which is configured such that an atmosphere gas is introduced into the chamber through the light guiding appliance.

6. The single-crystal fiber production equipment according to claim 1, further comprising a position control apparatus that controls a horizontal position of the single crystal fiber such that the horizontal position falls within a prescribed limited range.

7. A single-crystal fiber production method for producing a single crystal fiber, the method comprising:
   irradiating an upper surface of a raw material rod with a collimated laser beam to form a melt;
   immersing a seed single crystal in the melt; and
   pulling the seed single crystal upward,
   wherein the upper surface of the raw material rod is irradiated with the laser beam such that the melt has a donut-shaped temperature distribution in which a temperature in a central portion of the melt is less than a temperature at a periphery of the melt.

8. The single-crystal fiber production method according to claim 7, wherein the laser beam has a donut-shaped intensity distribution, wherein an intensity in a central portion of the laser beam is less than an intensity at a periphery of the laser beam.

9. The single-crystal fiber production method according to claim 7, wherein a radius of the raw material rod is equal to or larger than 10 times a radius of the single crystal fiber to be produced.

10. The single-crystal fiber production method according to claim 9, wherein, when the radius of the single crystal fiber to be produced is 100 μm or less, the radius of the raw material rod is in a range of 2 mm to 5 mm.

11. A single-crystal fiber production equipment for producing a single crystal fiber by irradiating an upper surface of a raw material rod with a laser beam within a chamber to form a melt, immersing a seed single crystal in the melt, and pulling the seed single crystal upward, the single-crystal fiber production equipment comprising:
   a laser light source that emits the laser beam as a collimated beam;
   a pulling device configured to be upward and downward movable in a vertical direction with the seed single crystal held thereby;
   a flat reflector that reflects the laser beam such that the reflected laser beam is incident vertically on the upper surface of the raw material rod,
   a light guiding appliance that houses a laser beam introduction window of the chamber and the flat reflector, wherein an atmosphere gas is introduced into the chamber through the light guiding appliance, and
   the single-crystal fiber production equipment being configured for the upper surface of the raw material rod to be irradiated with the laser beam such that the melt has a donut-shaped temperature distribution.

12. The single-crystal fiber production equipment of claim 11, wherein the laser beam has a donut-shaped intensity distribution, wherein an intensity in a central portion of the laser beam is less than an intensity at a periphery of the laser beam.

13. The single-crystal fiber production equipment according to claim 11, wherein a radius of the raw material rod is equal to or larger than 10 times a radius of the single crystal fiber to be produced.

14. The single-crystal fiber production equipment according to claim 13, wherein, when the radius of the single crystal fiber to be produced is 100 μm or less, the radius of the raw material rod is in a range of 2 mm to 5 mm.

15. The single-crystal fiber production equipment according to claim 11, further comprising a position control apparatus that controls a horizontal position of the single crystal fiber such that the horizontal position falls within a prescribed limited range.

* * * * *